United States Patent
Seo

(10) Patent No.: US 7,978,537 B2
(45) Date of Patent: Jul. 12, 2011

(54) SEMICONDUCTOR MEMORY DEVICE AND DRIVING METHOD THEREOF

(75) Inventor: Ju-Young Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 249 days.

(21) Appl. No.: 12/345,030

(22) Filed: Dec. 29, 2008

(65) Prior Publication Data

US 2010/0142295 A1    Jun. 10, 2010

(30) Foreign Application Priority Data

Dec. 4, 2008  (KR) .......................... 10-2008-0122533

(51) Int. Cl.
*G11C 16/04*  (2006.01)
(52) U.S. Cl. ............... 365/189.09; 365/194; 365/230.06
(58) Field of Classification Search .............. 365/189.09, 365/194, 230.06, 226, 189.14
See application file for complete search history.

(56) References Cited

U.S. PATENT DOCUMENTS 6,741,511 B2 *  5/2004  Nakao ....................... 365/230.06
6,987,703 B2 *  1/2006  Tanaka ........................... 365/226

FOREIGN PATENT DOCUMENTS

KR     100852002 B1    8/2008

OTHER PUBLICATIONS

Notice of Preliminary Rejection issued from Korean Intellectual Property Office on Apr. 30, 2010.

* cited by examiner

*Primary Examiner* — David Lam
(74) *Attorney, Agent, or Firm* — IP & T Group LLP

(57) ABSTRACT

A semiconductor memory device includes a source signal generator configured to generate a source signal having a predetermined pulse width in response to a command signal, and a column selection signal generator configured to generate a column selection signal by controlling a pulse width of the source signal according to a voltage level of an external supply voltage.

17 Claims, 6 Drawing Sheets

SEMICONDUCTOR MEMORY DEVICE AND DRIVING METHOD THEREOF

CROSS-REFERENCE(S) TO RELATED APPLICATIONS

The present invention claims priority of Korean patent application number 10-2008-0122533, filed on Dec. 4, 2008, which is incorporated by reference in its entirety.

BACKGROUND OF THE INVENTION

The present invention relates to a semiconductor design technology, and more particularly, to a semiconductor memory device for generating a column selection signal that is activated in response to a read operation and a write operation.

In general, a semiconductor memory device such as a Double Data Rate Synchronous DRAM (DDR SDRAM) includes more than several million memory cells for storing data and stores or outputs data according to a command from a central processing unit (CPU). That is, when the CPU requests a write operation, data is stored in a memory cell corresponding to an address inputted from the CPU. When the CPU requests a read operation, data stored in a memory cell corresponding to the input address is outputted. In other words, data received through an input/output pad from the outside is inputted to a memory cell through a data input path in case of a write operation. In case of a read operation, data stored in a memory cell passes through a data output path and is outputted to the outside through the input/output pad.

FIG. 1 is a diagram for describing a read operation and a write operation of a conventional semiconductor memory device. Although a semiconductor memory device is generally designed to include several million memory cells, one memory cell is shown for illustration. Here, a reference numeral 110 is assigned to the memory cell.

As shown, a read operation of the semiconductor memory device will be described.

At first, when a word line WL is selected by decoding a row address inputted according to a row command signal and the selected word line WL is activated, a cell transistor T1 of a memory cell 110 is turned on. Then, data stored in a cell capacitor C1 is charge-shared to a pre-charged bit line pair BL and /BL. The bit line BL and the complementary bit line /BL have a very small electric potential difference through a charge sharing operation. Here, a pre-charged voltage level has a ½ voltage level of a core voltage which is an internal voltage.

A bit line sense amplifier 120 senses very small electric potential of the bit line BL and the complementary bit line /BL and amplifies the sensed electric potential. In other words, if the electric potential of the bit line BL is higher than the electric potential of the complementary bit line /BL, the bit line BL is amplified to a full-up supply voltage RTO, and the complementary bit line BL is amplified to a full-down supply voltage SB. On the contrary, if the electric potential of the bit line BL is lower than the electric potential of the complementary bit line /BL, the bit line BL is amplified into a full down supply voltage SB, and the complementary bit line /BL is amplified to a full up supply voltage RTO.

Meanwhile, if a column selection signal YI is selected by decoding a column address inputted according to a column command signal, a column selector 130 is activated. Then, the bit line pair BL and /BL is connected to a segment input/output line pair SIO and /SIO. That is, amplified data from the bit line BL is transferred to a segment input/output line SIO, and amplified data from the complementary bit line /BL is transferred to a complementary segment input/output line /SIO.

Then, if an input/output switching unit 140 is activated in response to an input/output control signal CTR_IO corresponding to a column address, the segment input/output line pair SIO and /SIO is connected to the local input/output line pair LIO and /LIO. That is, data transferred to the segment input/output line SIO is transferred to the local input/output line LIO, and data transferred to the complementary segment input/output line /SIO is transferred to the complementary local input/output line /LIO. The read driver 150 drives a global input/output line GIO according to data transferred through the local input/output line pair LIO and /LIO.

Finally, data stored in the memory cell 110 is transferred from the bit line pair BL and /BL to a segment input/output line pair SIO and /SIO in response to a column selection signal YI, data transferred to the segment input/output line pair SIO and /SIO is transferred to the local input/output line pair LIO and /LIO in response to an input/output control signal CTR_IO, and data transferred to the local input/output line pair LIO and /LIO is transferred to a global input/output line GIO by the read driver 150. The transferred data is finally outputted to the outside through a corresponding input/output pad (not shown).

Meanwhile, in a write operation, data applied to the outside is transferred to an opposite direction of a read operation. That is, data applied through the input/output pad is transferred from the global input/output line GIO to the local input/output line pair LIO and /LIO by a write driver 160. The data is also transferred from the local input/output line pair LIO and /LIO to the segment input/output line pair SIO and /SIO, and from the segment input/output line pair SIO and /SIO to the bit line pair BL and /BL. Finally, the data is stored in the memory cell 110.

FIG. 2 is a block diagram illustrating configuration for generating a column selection signal YI of FIG. 1. That is, FIG. 2 illustrates an internal command signal generator 210, a pulse signal generator 230 and an address decoder 250.

The internal command signal generator 210 generates a read internal command signal CASPB_RD and a write internal command signal CASPB_WT in response to a column command signal CMD that is activated according to an external command signal from the outside. Here, the column command signal CMD is a signal activated for a read operation and a write operation of a semiconductor memory device. The read internal command signal CASPB_RD is a pulse signal activated in a read operation of a semiconductor memory device, and the write internal command signal CASPB_WT is a pulse signal activated in a write operation of a semiconductor memory device.

The pulse signal generator 230 generates a pulse signal AYP in response to the read internal command signal CASPB_RD and the write internal command signal CASPB_WT. Although it will be described again, the pulse signal AYP has a predetermined pulse width, and this pulse width is used as a reference that defines an active region of the column selection signal YI.

The address decoder 250 decodes address information ADD<0:N> where N is a natural number, and generates a column selection signal YI by reflecting the decoded address information to the pulse signal AYP. The column selection signal YI also has a pulse form, and a pulse width thereof corresponds to the pulse width of the pulse signal AYP. For better comprehension and easy description, one column selection signal YI is shown, and the column selection signal YI is one of a plurality of signals generated by decoding the column address signal ADD<0:N>.

FIG. 3 is a waveform for describing an operation waveform of each signal in FIG. 2 in a write operation. The waveform illustrates an external clock signal CLK, a write internal command signal CASPB_WT, a pulse signal AYP, and a column selection signal YI. And data applied to the bit line pair BL and /BL of FIG. 1 is shown. Hereinafter, the waveform will be described with reference to FIGS. 1 to 3. For better comprehension and easy description, it is assumed that data corresponding to a logic 'high' level is applied to the bit line BL before a write operation of data corresponding to a logic 'low' level.

At first, if an active command ACT is applied, a word line WL is activated, and the bit line and the complementary bit line BL and /BL have a very small potential difference through a charge sharing operation. Then, data applied to the bit line pair BL and /BL is amplified by the bit line sensing amplifier 120.

If a write command WT is applied, the write internal command signal CASPB_WT is activated. Accordingly, a pulse signal AYP having a predetermined pulse width is activated. The generated pulse signal AYP is referred to decide a pulse width of a column selection signal YI. Although it is not shown in FIG. 3, data of a logic 'low' level inputted from the outside with a write command WT is transferred to the segment input/output line pair SIO and /SIO through the global input/output line GIO and the local input/output line pair LIO and /LIO. Therefore, if the bit line pair BL and /BL is connected to the segment input/output line pair SIO and /SIO in an active region where the column selection signal YI is activated to the logic 'high' level, data applied to the segment input/output line pair SIO and /SIO is transferred to the bit line pair BL and /BL. As shown, the bit line BL is changed from data corresponding to logic 'high' level to data corresponding to logic 'low' level in a region where a column selection signal YI is activated to logic 'high' level, and a complementary bit line /BL is changed from data corresponding to logic 'low' level to data corresponding to logic 'high' level.

Here, a time taken for changing data applied to the bit line pair BL and /BL in a write operation may be changed according to an external supply voltage applied to a semiconductor memory device. That is, a time taken for raising a voltage level of the complementary bit line /BL from a voltage level corresponding to logic 'low' level to a voltage level corresponding to logic 'high' level is changed according to the external supply voltage. In case of a high voltage level of an external supply voltage, the time taken for raising the voltage level becomes shortened in proportion to the high voltage level of the external supply voltage. In case of a low voltage level of an external supply voltage, the time taken for raising the voltage level becomes extended in proportion to the low voltage level.

In case of a conventional semiconductor memory device, a pulse width of a column selection signal YI is fixed. Therefore, the bit line pair BL and /BL is connected to the segment input/output line pair SIO and /SIO only for a predetermined time although a voltage level of an external supply voltage is changed. It may cause following two problems.

At first, if a voltage level of an external supply voltage is low, a time taken for changing data of the bit line pair BL and /BL becomes extended in proportion to a low voltage level of the external supply voltage. Since the bit line pair BL and /BL is connected to the segment input/output line pair SIO and /SIO only for a scheduled time, data of the bit line pair BL and /BL may not be completely changed. It means that data is not accurately transferred to the bit line pair BL and /BL. Finally, desired data cannot be stored in the memory cell 110 (See FIG. 1).

Secondly, if a voltage level of an external supply voltage is high, a time taken for changing data of the bit line pair BL and /BL is shortened in proportion to a high voltage level of the external supply voltage. However, a semiconductor memory device may consume electric power unnecessarily because the time of connecting the bit line pair BL and /BL with the segment input/output line pair SIO and /SIO is unnecessary long. Furthermore, circuit operation efficiency may be deteriorated because the column selection signal YI is activated for unnecessarily long time.

SUMMARY OF THE INVENTION

Some embodiments of the present invention are directed to providing a semiconductor memory device for controlling a pulse width of a column selection signal according to a voltage level of an external supply voltage.

Some embodiments of the present invention are also directed to providing a method for generating a column selection signal having a pulse width corresponding to a voltage level of an external supply voltage.

In accordance with an aspect of the present invention, there is provided a semiconductor memory device including a source signal generator configured to generate a source signal having a predetermined pulse width in response to a command signal, and a column selection signal generator configured to generate a column selection signal by controlling the pulse width of the source signal according to a voltage level of an external supply voltage.

In accordance with another aspect of the present invention, there is provided a semiconductor memory device including a column selection signal generator configured to generate a column selection signal having a pulse width corresponding to a voltage level of an external supply voltage in response to a command signal, and a column selector configured to connect a first data line connected to a memory cell to a second data line for a time corresponding to a pulse width of the column selection signal.

The present invention can guarantee an enough data transfer time for transferring data from a bit line pair to a segment input/output line pair in a semiconductor memory device having a low voltage level of an external supply voltage by controlling a pulse width of a column selection signal according to a voltage level of the external supply voltage. Also, the present invention may provide minimum power consumption and effective circuit operation in a semiconductor memory device having a high voltage level of an external supply voltage.

DESCRIPTION OF SPECIFIC EMBODIMENTS

Other objects and advantages of the present invention can be understood by the following description, and become apparent with reference to the embodiments of the present invention.

Figure 1:
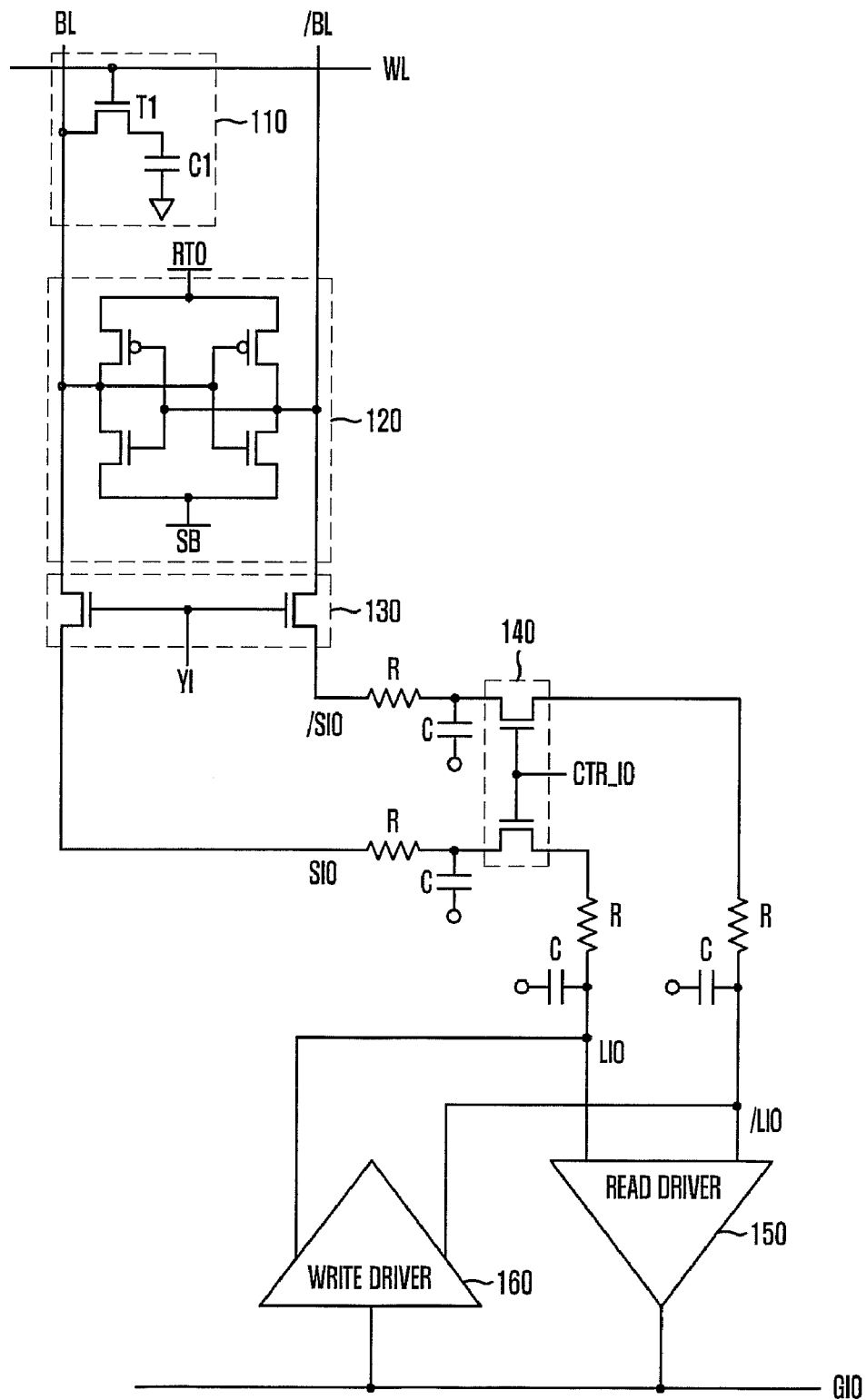
FIG. 1 is a diagram for describing a read operation and a write operation of a conventional semiconductor memory device.
Figure 2:
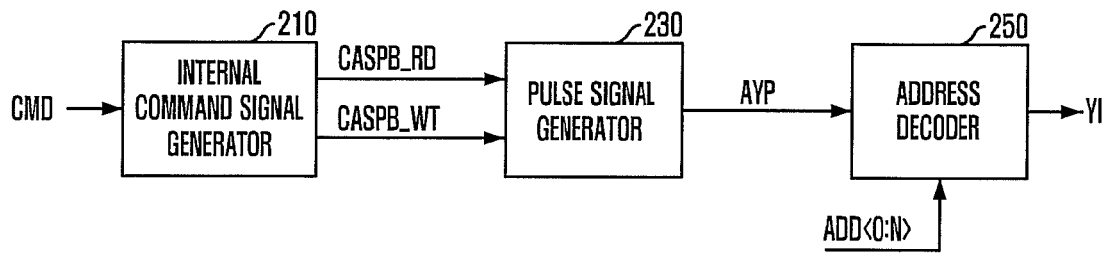
FIG. 2 is a block diagram illustrating configuration related to generating a column selection signal YI of FIG. 1.
Figure 3:
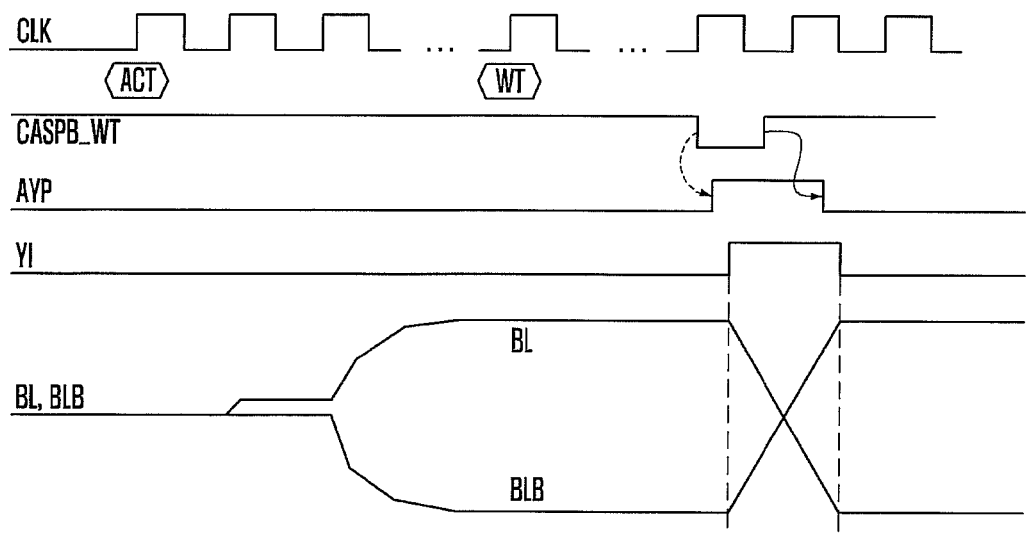
FIG. 3 is a waveform diagram for describing an operation waveform of each signal of FIG. 2 in a write operation.
Figure 4:
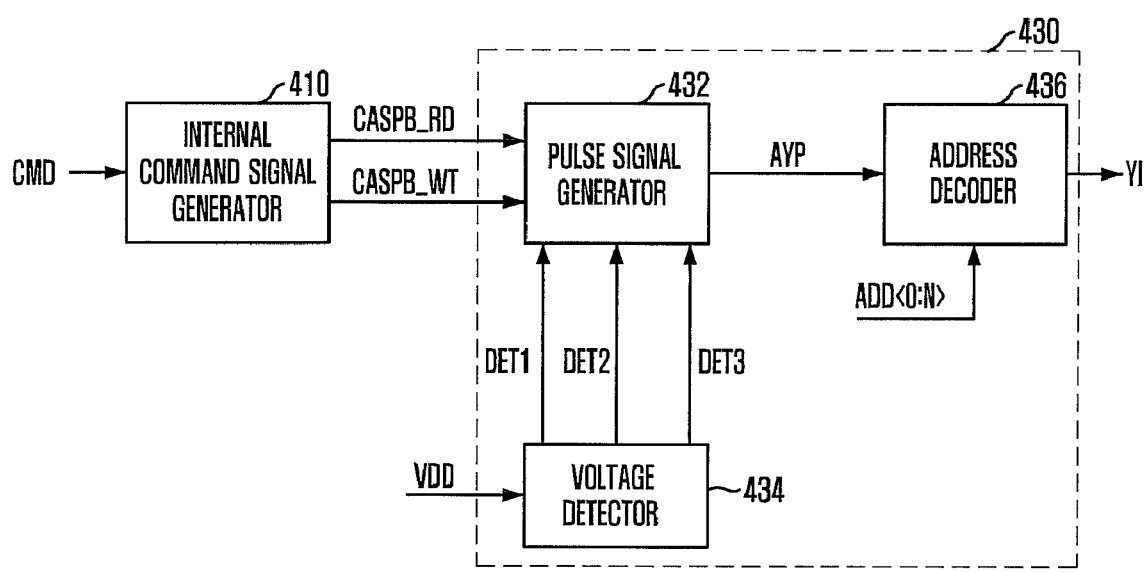
FIG. 4 is a block diagram illustrating a part of a semiconductor memory device in accordance with an embodiment of the present invention.

FIG. 4 is a block diagram illustrating a part of a semiconductor memory device in accordance with an embodiment of the present invention.

As shown, the semiconductor memory device includes an internal command signal generator 410 and a column selection signal generator 430.

The internal command signal generator 410 generates a read internal command signal CASPB_RD and a write internal command signal CASPB_WT in response to a column command signal CMD that is activated according to an external command signal. The column command signal CMD is a signal that is activated when a semiconductor memory device performs a read operation and a write operation. The read internal command signal CASPB_RD is a pulse signal activated when the semiconductor memory device performs a read operation, and the write internal command signal CASPB_WT is a pulse signal activated when the semiconductor device performs a write operation. The read and write internal command signals CASPB_RD and CASPB_WT become a source signal of the column selection signal YI and have a predetermined pulse width.

The column selection signal generator 430 controls a pulse width of the read internal command signal CASPB_RD according to a voltage level of the external supply voltage VDD when a semiconductor memory device performs a read operation and controls a pulse width of the write internal command signal CASPB_WT according to a voltage level of the external supply voltage VDD when a semiconductor memory device performs a write operation. The column selection signal generator 430 includes a pulse signal generator 432, a voltage detector 434, and an address decoder 436.

The pulse signal generator 432 may control pulse widths of the read internal command signal CASPB_RD and the write internal command signal CAASPB_WT in response to first to third detection signals DET1, DET2, and DET3. The pulse signal generator 432 according to the present embodiment may generate a pulse signal AYP having a pulse width corresponding to the first to third detection signals DET1, DET2, and DET3.

Figure 5:
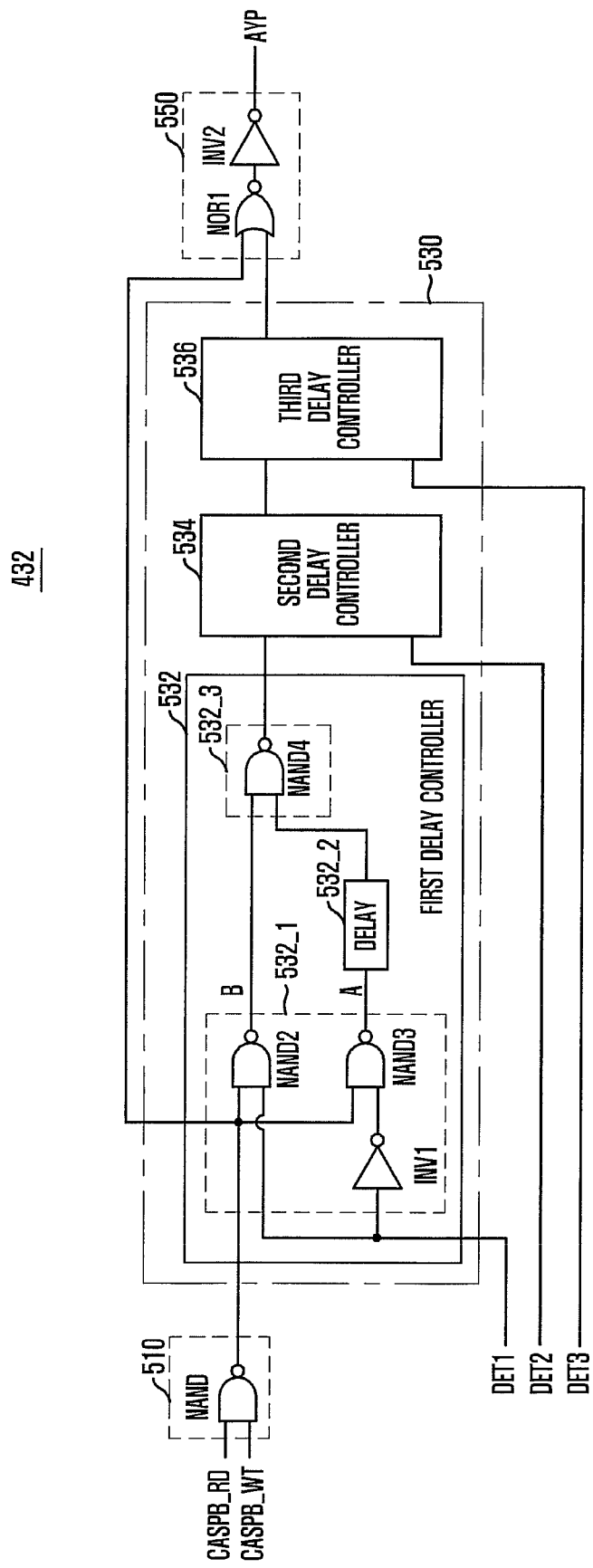
FIG. 5 is a circuit diagram illustrating a pulse signal generator 432 of FIG. 4.

FIG. 5 is a circuit diagram illustrating a pulse signal generator 432 of FIG. 4.

As shown, the pulse signal generator 432 includes an internal command signal input unit 510, a delay controller 530, and a pulse signal output unit 550.

The internal command signal input unit 510 receives the read internal command signal CASPB_RD and the write internal command signal CASPB_WT which are source signals, and includes a first NAND gate NAND1.

The delay controller 530 delays an output signal of the internal command signal input unit 510 as long as a time corresponding to first to third detection signals DET1, DET2, and DET3. The delay controller 530 includes first to third delay controllers 532, 534, and 536. Although the delay controller 530 includes three delay controllers 532, 534, and 536 corresponding to the first to third detection signals DET1, DET2, and DET3 in the present embodiment, the number of the delay controllers may vary according to the number of the detection signals. Although the first to third detection signals DET1, DET2, and DET3 will be described in detail in later, the first to third detection signals DET1, DET2, and DET3 include information corresponding to a voltage level of the external supply voltage VDD.

The first delay controller 532 determines whether an output signal of the internal command signal input unit 510 is delayed or not in response to the first detection signal DET1, and the second delay controller 534 determines whether the output signal of the first delay controller 532 is delayed or not in response to the second detection signal DET2. Also, the third delay controller 536 determines whether the output signal of the second delay controller 534 is delayed or not in response to the third detection signal DET3. Since configurations of the first to third delay controllers 532 534, and 536 are identical to each others, the first delay controller 532 will be described representatively.

The first delay controller 532 includes a multiplexer 532_1, a delay 532_2 and an output unit 532_3.

The multiplexer 532_1 multiplexes an output signal of the internal command signal input unit 510 in response to the first detection signal DET1. The multiplexer 532_1 includes a second NAND gate NAND2 for receiving an output signal of the internal command signal input unit 510 and the first detection signal DET1, a first inverter INV1 for inverting the first detection signal DET1, and a third NAND gate NAND3 for receiving an output signal of the internal command signal input unit 510 and an output signal of the first inverter INV1.

The delay unit 532_2 delays a signal inputted through a first output end A of the multiplexer 532_1 as long as a predetermined time. For example, the delay unit 532_2 may be configured with a plurality of inverters or with a resistor and a capacitor.

The output unit 532_3 generates an output signal in response to a signal inputted through a second output end B of the multiplexer 532_1 and an output signal of the delay unit 532_2. The output unit 532_3 may include a fourth NAND gate NAND4.

Hereinafter, operation of the first delay controller 532 will be described.

If the first detection signal DET1 is logic 'high' level, an output signal of the internal command signal input unit 510 is delayed as long as a time corresponding to the second and fourth NAND gates NAND2 and NAND4. If the first detection signal DET1 is logic 'low' level, an output signal of the internal command signal unit 510 is delayed as long as a time corresponding to the third and fourth NAND gates NAND3 and NAND4 and the delay unit 532_2. If delay times corresponding to the second to fourth NAND gates NAND2, NAND3, and NAND4 are not considered, the first delay controller 532 reflects or does not reflects the delay time corresponding to the delay unit 532_2 to the output signal of the internal command signal input unit 510 according to the first detection signal DET1.

The pulse signal output unit 550 receives an output signal of the internal command signal input unit 510 and an output signal of the delay controller 530 and outputs a pulse signal AYP. The pulse signal output unit 550 includes a first NOR gate NOR1 and a second inverter INV2. Here, a pulse width of the pulse signal AYP decides a pulse width of a column selection signal YI.

Finally, the pulse signal generator 432 delays an output signal of the internal command signal input unit 510 as long as a time corresponding to the first to third detection signals DET1, DET2, and DET3 and generates a pulse signal AYP corresponding to an output signal of the internal command signal input unit 510 and the delayed time. The generated pulse signal AYP has a pulse width corresponding to the first to third detection signals DET1, DET2 and DET3. That is, the pulse signal AYP is activated in response to an output signal of the internal command signal input unit 510 and inactivated in response to an output signal of the third delay controller 536. In other words, the first to third detection signals DET1, DET2, and DET3 have information corresponding to a voltage level of an external supply voltage VDD. Therefore, the pulse width of the pulse signal AYP may vary according to the voltage level of the external supply voltage VDD.

Referring to FIG. 4 again, the voltage detector 434 detects a voltage level of the external supply voltage VDD and generates first to third detection signals DET1, DET2, and DET3.

Figure 6:
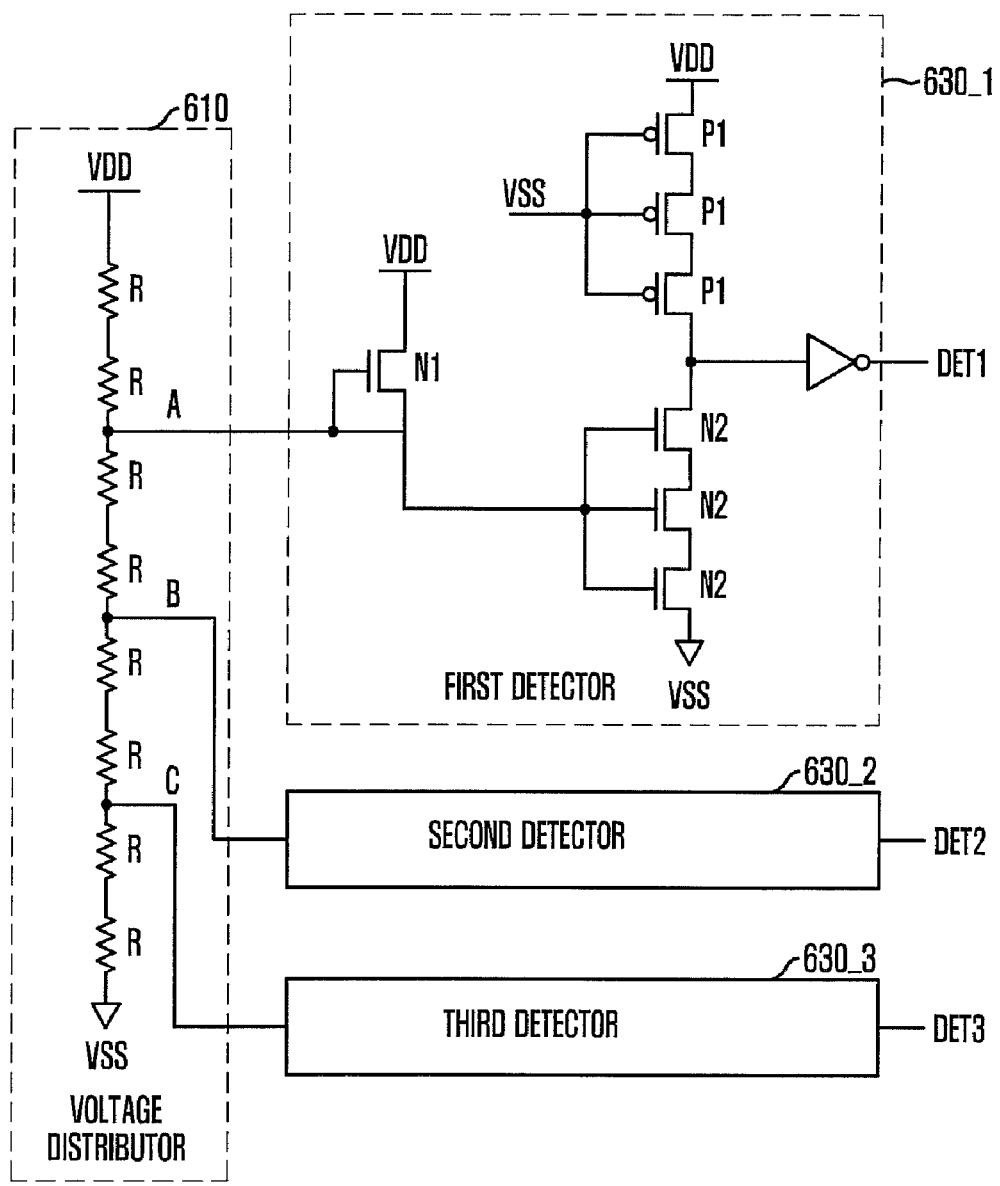
FIG. 6 is a circuit diagram illustrating a voltage detector 434 of FIG. 4.

FIG. 6 is a circuit diagram illustrating a voltage detector 434 of FIG. 4.

As shown, the voltage detector 434 includes a voltage distributor 610, and first to third detectors 630_1, 630_2, and 630_3.

The voltage distributor 610 distributes a voltage level of an external supply voltage VDD and outputs the distributed voltage levels to an A node, a B node, and a C node. The voltage distributor 610 includes a plurality of registers R connected in serial between an external supply voltage end and a ground supply voltage end.

The first to third detectors 630_1, 630_2, and 630_3 detect a voltage level of a corresponding node and output the first to third detection signals DET1, DET2, and DET3. That is, the first detector 630_1 detects a voltage level of the A node, the second detector 630_2 detects a voltage level of the B node, and the third detector 630_3 detects a voltage level of the C node. Since the first to third detectors 630_1, 630_2, and 630_3 have the same configuration, the first detector 630_1 will be described representatively.

The first detector 630_1 includes a plurality of NMOS transistors and PMOS transistors. Here, a first NMOS transistor N1 performs stable operation of a plurality of second NMOS transistors N2, and the plurality of second NMOS transistors N2 perform a pull-down operation to a common node commonly connected to a plurality of first PMOS transistors P1 according to a voltage level of the A node. The plurality of first PMOS transistors P1 determines an initial level of the first detection signal DET1 and perform a pull-up operation to the common node according to a voltage level of the A node. If the voltage level of the A node increases to a predetermined level that can turn on the plurality of second NMOS transistors N2, the first detection signal DET1 transits from logic 'low' level, which is an initial level, to logic 'high' level.

Hereinafter, overall operation of the voltage detector 434 will be described.

In case of a semiconductor memory device having a comparatively low voltage level of an external supply voltage VDD, the third detection signal DET3 transits to logic 'high' level in response to a voltage level of the C node. In case of a semiconductor memory device having a voltage level of the external supply voltage VDD higher than the comparatively low voltage level, the second and third detection signals DET2 and DET3 transit to logic 'high' level in response to voltage levels of the B node and the C node. In case of a semiconductor memory device having a comparatively high voltage level of the external supply voltage VDD, the first to third detection signals DET1, DET2 and DET3 transit to logic 'high' level in response to voltage levels of the A node, the B node and the C node.

Referring to FIG. 4, the address decoder 436 decodes address information ADD<0:N> and generates a column selection signal YI by reflecting the decoded address information to the pulse signal AYP. The column selection signal YI has a pulse form, and the pulse width of the column selection signal YI corresponds to the pulse width of the pulse signal AYP. For illustration purposes, one column selection signal YI is shown, and the column selection signal YI is one of a plurality of signals generated by decoding the column address signal ADD<0:N>. The pulse width of the column selection signal YI can be controlled according to a voltage level of the external supply voltage VDD like the pulse signal AYP having a controllable pulse width.

Figure 7:
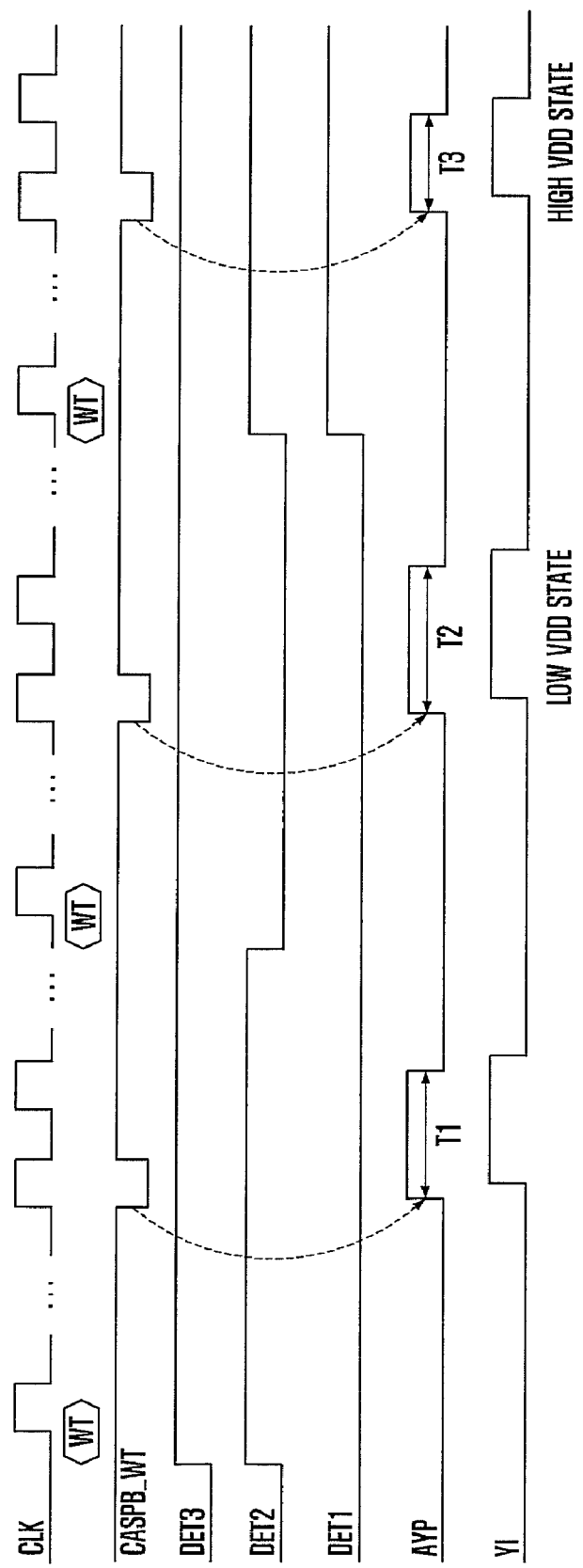
FIG. 7 is a waveform illustrating operation waveforms of signals shown in FIGS. 4 to 6.

FIG. 7 is a waveform illustrating operation waveforms of signals shown in FIGS. 4 to 6 in a write operation. The waveform shows an external clock signal CLK, a write internal command signal CASPB_WT, first to third detection signals DET1, DET2, and DET3, a pulse signal AYP, and a column selection signal YI. FIG. 7 shows the waveforms of signals when an external supply voltage VDD has a comparatively high voltage level, when an external supply voltage VDD has a comparatively low voltage level, and when an external supply voltage VDD has a voltage level between the comparatively high voltage level and the comparatively low voltage level.

In case of the external supply voltage having the voltage level between the comparatively high and low voltage levels, the write internal command signal CASPB_WT is activated if a write command WT is applied. Here, the pulse width of the pulse signal AYP has a pulse width corresponding to T1 by a reflected delay time according to the first to third detection signals DET1, DET2 and DET3. It may be used to decide a pulse width of the column selection signal YI. In more detail, the first detection signal DET1 may become logic 'low' level, and the second and third detection signals DET2 and DET3 may become logic 'high' level. Therefore, the output signal of the internal command signal input unit 510 is passed through the delay 532_2 corresponding to the first detection signal DET1 of FIG. 5, and the pulse signal AYP has a T1 pulse width as long as a time corresponding to the delay 532_2.

In case of the external supply voltage VDD having a comparatively low voltage level, the write internal command signal CASPB_WT is activated if the write command VT is applied. Here, the first and second detection signals DET1 and DET2 become logic 'low' level, and the third detection signal DET3 becomes logic 'high' level. That is, the output signal of the internal command signal input unit 510 is passed through two delay units corresponding to the first and second detection signals DET1 and DET2, and the pulse signal AYP has a T2 pulse width as long as a time corresponding to two delay units.

In case of the external supply voltage VDD having a comparatively high voltage level, the first to third detection signals DET1, DET2 and DET3 transit to logic 'high' level. That is, the output signal of the internal command signal input unit 510 is passed through delay units and the pulse signal AYP has a T3 pulse width as long as a time, corresponding to the first to third detection signals DET1, DET2 and DET3.

If the voltage level of the external supply voltage VDD is low, the pulse width of the pulse signal AYP becomes T2 which is longer than T1. If the voltage level of the external supply voltage VDD is high, the pulse width of the pulse signal AYP becomes T3 which is shorter than T1.

A conventional semiconductor memory device may generate a column selection signal YI with a fixed pulse width regardless of a voltage level of an external supply voltage VDD. Therefore, when the voltage level of the external supply voltage VDD is low, it may be difficult to guarantee an enough time to transfer data from a segment input/output line pair SIO and /SIO to a bit line pair BL and /BL. Also, the conventional semiconductor memory device may unnecessarily consume electric power, and the circuit operation efficiency thereof may be deteriorated when the voltage level of the external supply voltage VDD is high.

However, the semiconductor memory device according to the present embodiment generates the column selection signal having the pulse width corresponding to the voltage level of the external supply voltage VDD. The pulse width of the column selection signal YI may correspond to a time for connecting the segment input/output line pair SIO and /SIO, which is a first data line, and the bit line pair BL and /BL, which is a second data line. Therefore, it is possible to obtain enough time for transferring data from the segment input/output line pair SIO and /SIO to the bit line pair BL and /BL by increasing the pulse width of the column selection signal YI when the voltage level of the external supply voltage VDD is low. If the voltage level of the external supply voltage VDD is high, electric power can be effectively consumed, and a circuit operation can be effectively performed by reducing the pulse width of the column selection signal YI.

While the present invention has been described with respect to the specific embodiments, it will be apparent to those skilled in the art that various changes and modifications may be made without departing from the spirit and scope of the invention as defined in the following claims.

Although the present invention was described based on the write operation, the present invention can be applied to the read operation. Although the present invention was described based on operation in the bit line pair BL and /BL and the segment input/output line pair SIO and /SIO, the present invention can be applied to operation for transferring data from any data line to the others.

Furthermore, the logical gate and the transistor described in the above described embodiments may be modified according to a polarity of an input signal.

Some embodiments of the present invention relate to a semiconductor memory device for generating a column selection signal that is activated in response to a read operation and a write operation. An enough data transfer time between data lines can be guaranteed by generating a column selection signal corresponding to a voltage level of an external supply voltage.

Also, unnecessary power consumption may be prevented, and circuit operation efficiency can be improved for performing operation related to the column selection signal.

What is claimed is:

1. A semiconductor memory device comprising:
   a source signal generator configured to generate a source signal having a pulse width in response to a command signal; and
   a column selection signal generator configured to generate a column selection signal by changing the pulse width of the source signal in response to a change in a voltage level of an external supply voltage.

2. The semiconductor memory device of claim 1, wherein the column selection signal generator includes:
   a voltage detector configured to generate a detection signal by detecting the voltage level of the external supply voltage;
   a pulse signal generator configured to control the pulse width of the source signal in response to the detection signal; and
   an address decoder configured to use an output signal of the pulse signal generator to generate an output signal of the address decoder in response to a decoding of address information.

3. The semiconductor memory device of claim 2, wherein the pulse signal generator includes:
   a delay controller configured to delay the source signal by a delay time corresponding to the detection signal; and
   a pulse signal output unit configured to receive the source signal and an output signal of the delay controller to output a pulse signal determining a pulse width of the column selection signal.

4. The semiconductor memory device of claim 3, wherein the source signal is activated for a read operation or a write operation, and the pulse signal generator further includes an input unit for receiving the source signal and outputting the source signal to the delay controller.

5. The semiconductor memory device of claim 3, wherein the delay controller includes:
   a multiplexer configured to multiplex the source signal in response to the detection signal;
   a delay unit configured to delay a signal inputted through a first output end of the multiplexer; and
   an output unit configured to generate an output signal in response to a signal inputted through a second output end of the multiplexer and an output signal of the delay unit.

6. The semiconductor memory device of claim 3, wherein the column selection signal has a pulse width defined by an output signal of the delay controller and the source signal.

7. The semiconductor memory device of claim 3, wherein the pulse signal generator includes a plurality of delay controllers that are responsive to the detection signal.

8. The semiconductor memory device of claim 2, wherein the voltage detector includes:
   a voltage distributor configured to distribute the external supply voltage; and
   a detector configured to detect the voltage level of the external supply voltage in response to an output signal of the voltage distributor.

9. The semiconductor memory device of claim 1, further comprising a switch configured to connect a first data line to a second data line in response to the column selection signal.

10. A semiconductor memory device comprising:
    a column selection signal generator configured to generate a column selection signal having a pulse width that changes in response to a change in a voltage level of an external supply voltage and in response to a command signal; and
    a column selector configured to connect a first data line connected to a memory cell to a second data line for a time corresponding to a pulse width of the column selection signal.

11. The semiconductor memory device of claim 10, wherein the column selection signal generator includes:
    a voltage detector configured to generate a detection signal by detecting the voltage level of the external supply voltage;
    a pulse signal generator configured to control a pulse width of a source signal corresponding to the command signal in response to the detection signal; and
    an address decoder configured to select an output signal of the pulse signal generator by decoding address information.

12. The semiconductor memory device of claim 11, wherein the pulse signal generator includes:
    a delay controller configured to delay the source signal for a delay time corresponding to the detection signal; and a pulse signal output unit configured to receive the source signal and an output signal of the delay controller to output a pulse signal determining a pulse width of the column selection signal.

13. The semiconductor memory device of claim 12, wherein the source signal is activated for a read operation or a write operation, and the pulse signal generator further includes an input unit configured to receive the source signal and outputting the source signal to the delay controller.

14. The semiconductor memory device of claim 12, wherein the delay controller includes:
- a multiplexer configured to multiplex the source signal in response to the detection signal;
- a delay unit configured to delay a signal inputted through a first output end of the multiplexer; and
- an output unit configured to generate an output signal in response to a signal inputted through a second output end of the multiplexer and an output signal of the delay unit.

15. The semiconductor memory device of claim 12, wherein the column selection signal has a pulse width determined based on an output signal of the delay controller and the source signal.

16. The semiconductor memory device of claim 12, wherein the pulse signal generator includes a plurality of delay controllers that are responsive to the detection signal.

17. The semiconductor memory device of claim 11, wherein the voltage detector includes:
- a voltage divider configured to divide the external supply voltage; and
- a detector configured to detect the voltage level of the external supply voltage in response to an output signal of the voltage divider.

* * * * *